(12) United States Patent
Shibata

(10) Patent No.: US 11,658,169 B2
(45) Date of Patent: May 23, 2023

(54) SEMICONDUCTOR DEVICE

(71) Applicant: KIOXIA CORPORATION, Tokyo (JP)

(72) Inventor: Junichi Shibata, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 25 days.

(21) Appl. No.: 17/006,643

(22) Filed: Aug. 28, 2020

(65) Prior Publication Data

US 2021/0296299 A1 Sep. 23, 2021

(30) Foreign Application Priority Data

Mar. 23, 2020 (JP) .............................. JP2020-051025

(51) Int. Cl.
  *H01L 25/18* (2006.01)
  *H01L 25/00* (2006.01)
  *H01L 23/00* (2006.01)

(52) U.S. Cl.
  CPC .............. *H01L 25/18* (2013.01); *H01L 24/05* (2013.01); *H01L 24/08* (2013.01); *H01L 24/32* (2013.01); *H01L 24/83* (2013.01); *H01L 24/94* (2013.01); *H01L 25/50* (2013.01); *H01L 2224/05647* (2013.01); *H01L 2224/08145* (2013.01); *H01L 2224/32054* (2013.01); *H01L 2224/32059* (2013.01); *H01L 2224/32145* (2013.01); *H01L 2224/80203* (2013.01); *H01L 2224/83139* (2013.01); *H01L 2224/83203* (2013.01)

(58) Field of Classification Search
  CPC combination set(s) only.
  See application file for complete search history.

(56) References Cited

U.S. PATENT DOCUMENTS

| 10,685,875 | B2 | 6/2020 | Hatano | |
| 10,790,300 | B2 * | 9/2020 | Rajashekhar | H01L 27/11575 |
| 2011/0095382 | A1 * | 4/2011 | Shimooka | B81C 1/00476 257/415 |
| 2017/0103995 | A1 * | 4/2017 | Hatano | H01L 27/11582 |
| 2017/0352598 | A1 * | 12/2017 | Lee | H01L 21/84 |
| 2019/0279952 | A1 * | 9/2019 | Tagami | H01L 24/80 |
| 2019/0280001 | A1 * | 9/2019 | Terasawa | H01L 27/1157 |
| 2020/0279862 | A1 * | 9/2020 | Rajashekhar | H01L 27/11573 |
| 2020/0286876 | A1 * | 9/2020 | Nakaki | H01L 25/0657 |
| 2020/0357811 | A1 * | 11/2020 | Kim | H01L 23/528 |
| 2020/0357814 | A1 * | 11/2020 | Kim | H01L 27/11573 |
| 2021/0057376 | A1 * | 2/2021 | Nakanishi | H01L 24/89 |
| 2021/0082865 | A1 * | 3/2021 | Baraskar | H01L 24/32 |

FOREIGN PATENT DOCUMENTS

| CN | 102157537 B | * | 5/2016 | ............ H01L 21/76 |
| JP | 2019140178 A | | 8/2019 | |

* cited by examiner

*Primary Examiner* — Telly D Green

(74) *Attorney, Agent, or Firm* — Kim & Stewart LLP

(57) ABSTRACT

A semiconductor device has a first substrate including an element region, a peripheral region that surrounds the element region, a first insulator with a first recess portion in the peripheral region, a first metal layer in the element region, and a first conductor in the peripheral region to surround the element region. A second substrate has an element region, a peripheral region that surrounds the element region, a second insulator with a second recess portion that faces the first recess portion, a second metal layer in contact with the first metal layer, and a second conductor that surrounds the element region of the second substrate.

14 Claims, 16 Drawing Sheets

SEMICONDUCTOR DEVICE

CROSS-REFERENCE TO RELATED APPLICATION(S)

This application is based upon and claims the benefit of priority from Japanese Patent Application No. 2020-051025, filed Mar. 23, 2020, the entire contents of which are incorporated herein by reference.

FIELD

Embodiments described herein relate generally to a semiconductor device.

BACKGROUND

In one semiconductor device manufacturing technique, two semiconductor wafers, each having an integrated circuit formed thereon, are attached to each other. By such an attachment technique, a high-performance or highly integrated semiconductor device can be achieved. For example, a semiconductor wafer having a memory cell array and a semiconductor wafer having a control circuit for controlling a memory cell array can be attached to each other, and then heated to bond the wafers to each other. These bonded semiconductor wafers are subsequently divided (diced) into a plurality of chips. Thus, a high-performance or highly integrated semiconductor memory device can be produced.

DETAILED DESCRIPTION

Figure 1:
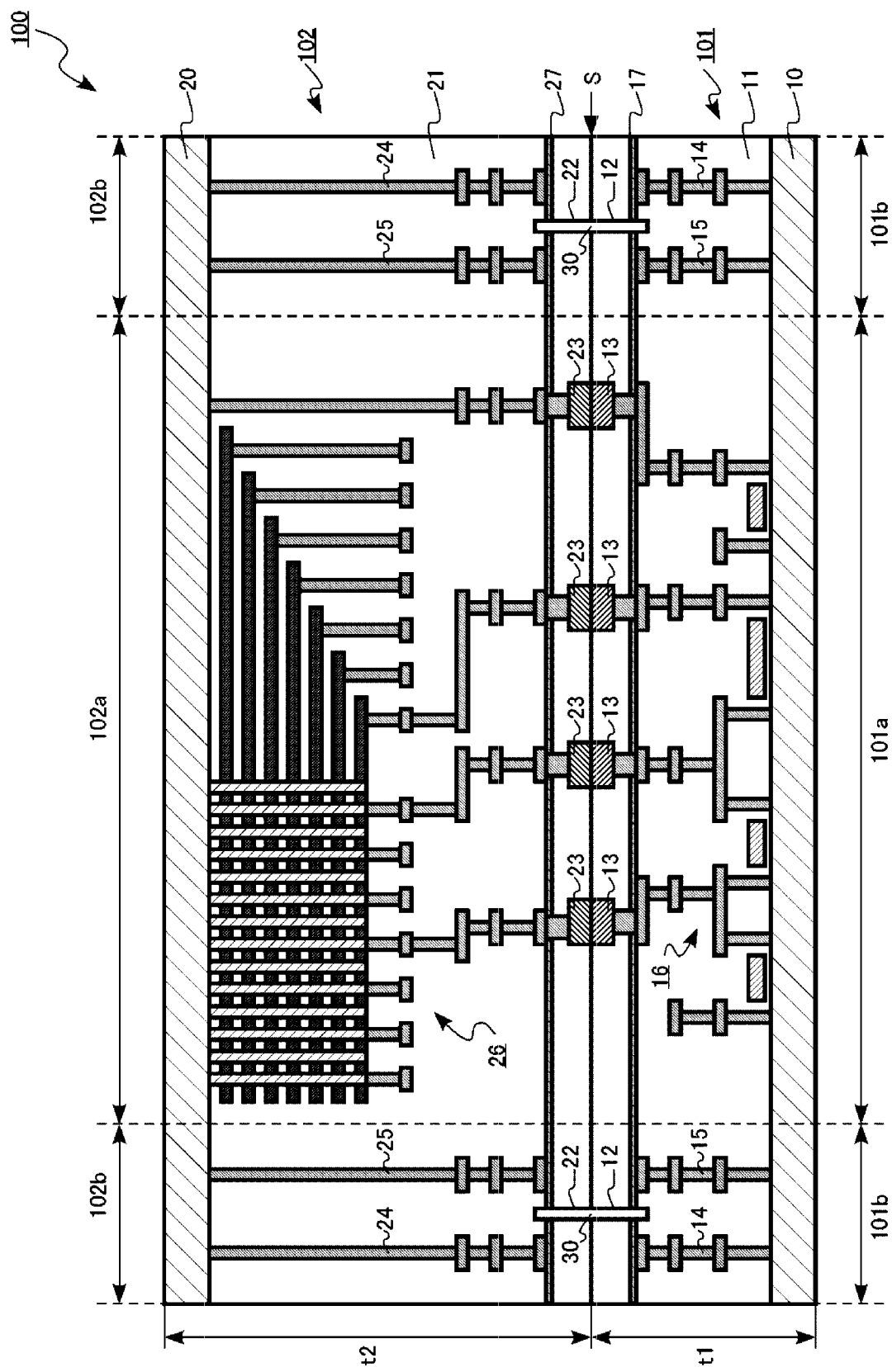
FIG. 1 is a schematic cross-sectional view of a semiconductor device of a first embodiment.

Embodiments provide a semiconductor device that can be produced with decreased defects being caused by dicing.

In general, according to one embodiment, a semiconductor device includes a first substrate and a second substrate. The first substrate includes a first element region, a first peripheral region that surrounds the first element region, a first insulator in the first element region and the first peripheral region and has a first recess portion in the first peripheral region, a first metal layer in the first element region, and a first conductor in the first peripheral region in the first insulator. The first conductor surrounds the first element region. The second substrate includes a second element region, a second peripheral region that surrounds the second element region, a second insulator in the second element region and the second peripheral region and in contact with the first insulator, the second insulator having a second recess portion that is in the second peripheral region and faces the first recess portion, a second metal layer in the second element region and contacting the first metal layer, and a second conductor in the second peripheral region in the second insulator. The second conductor surrounds the second element region.

Hereinafter, certain example embodiments of the present disclosure will be described with reference to the drawings. In the following description, the same or similar members, components, or aspects are given the same reference numerals. The description of a member, components, or aspects that have been described in conjunction with an embodiment may be omitted with regard to subsequently described embodiments.

The terms "upper" or "lower" may be used herein for the sake of convenience. Such terms as "upper" or "lower" represents a relative positional relationship as depicted in the drawings and do not necessarily define a positional relationship with respect to gravity.

Qualitative and quantitative analysis of a chemical composition of a components, regions, or aspects of a semiconductor device as described herein can be performed based on secondary ion mass spectrometry (SIMS) and/or an energy-dispersive X-ray spectroscopy (EDX). For measurement of a thickness (or other dimensions) of the components, regions, or aspects constituting a semiconductor device, or a distance between components, regions, aspects, or the like, a transmission electron microscope (TEM) or a scanning electron microscope (SEM) can be used, for example.

First Embodiment

A semiconductor device of a first embodiment includes a first substrate that has a first element region, a first peripheral region that surrounds the first element region, a first insulator that is provided in the first element region and the first peripheral region and includes a first recess portion in the first peripheral region, a first metal layer that is provided in the first element region, and a first conductor that is provided in the first insulator in the first peripheral region, and surrounds the first element region. A second substrate includes a second element region, a second peripheral region that surrounds the second element region, a second insulator that is provided in the second element region and the second peripheral region, includes a second recess portion facing the first recess portion in the second peripheral region, and is in contact with the first insulator, a second metal layer that is provided at the second element region and is in contact with the first metal layer, and a second conductor that is provided in the second insulator in the second peripheral region and surrounds the second element region.

The semiconductor device of the first embodiment is a flash memory 100. The flash memory 100 is a three-dimensional NAND flash memory in which memory cells are three-dimensionally arranged.

FIG. 1 is a schematic cross-sectional view of the semiconductor device of the first embodiment.

The flash memory 100 of the first embodiment includes a control chip 101 and a memory chip 102. The control chip 101 is an example of the first substrate. The memory chip 102 is an example of the second substrate.

The control chip 101 and the memory chip 102 are bonded at a sticking interface S.

The control chip 101 includes a first element region 101a, a first peripheral region 101b, a first semiconductor layer 10, a first interlayer region 11, a first recess portion 12, a plurality of first metal pads 13, a first outer edge sealing structure 14, a first inner edge sealing structure 15, a control circuit 16, and a first diffusion preventing layer 17.

The first interlayer region 11 is an example of the first insulator region. The first metal pads 13 are each an example of the first metal layer. The first outer edge sealing structure 14 is an example of the first conductor. The first inner edge sealing structure 15 is an example of a third conductor. The first diffusion preventing layer 17 is an example of a first insulating layer.

The memory 102 includes a second element region 102a, a second peripheral region 102b, a second semiconductor layer 20, a second interlayer region 21, a second recess portion 22, a plurality of second metal pads 23, a second outer edge sealing structure 24, a second inner edge sealing structure 25, a memory cell array 26, and a second diffusion preventing layer 27.

The second interlayer region 21 is an example of the second insulator region. The second metal pads 23 are each an example of the second metal layer. The second outer edge sealing structure 24 is an example of the second conductor.

The flash memory 100 has a cavity 30.

FIGS. 2, 3, 4, and 5 are schematic cross-sectional views illustrating a method for producing the semiconductor device of the first embodiment.

Figure 2:
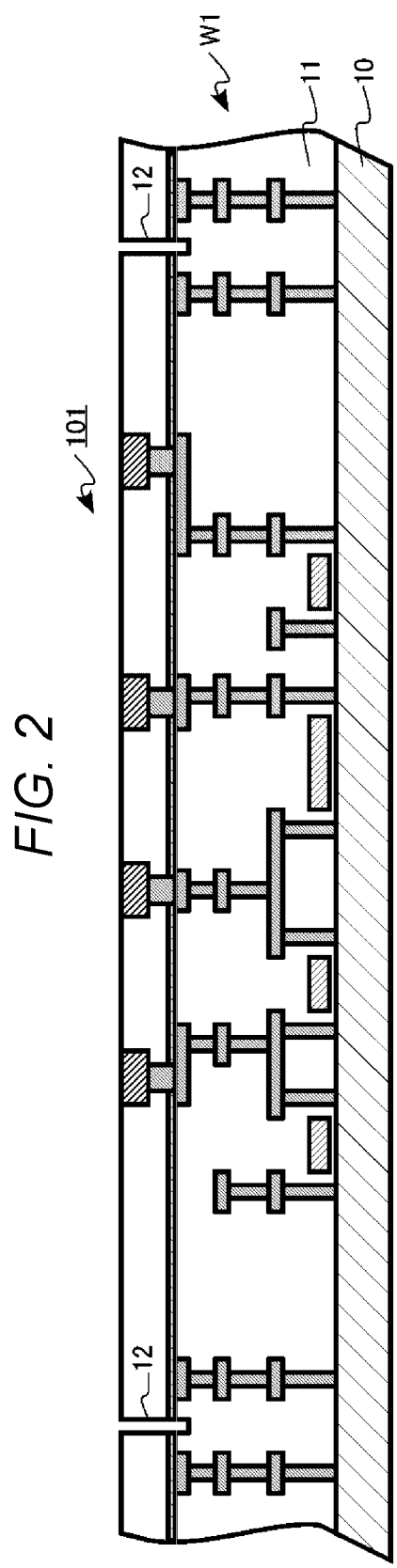
FIGS. 2-5 are schematic cross-sectional view illustrating aspects related to a method of producing a semiconductor device of a first embodiment.

A first wafer W1 having a plurality of control chips 101 is first produced (FIG. 2). On a surface of the first wafer W1, first recess portions 12 are formed.

Figure 3:
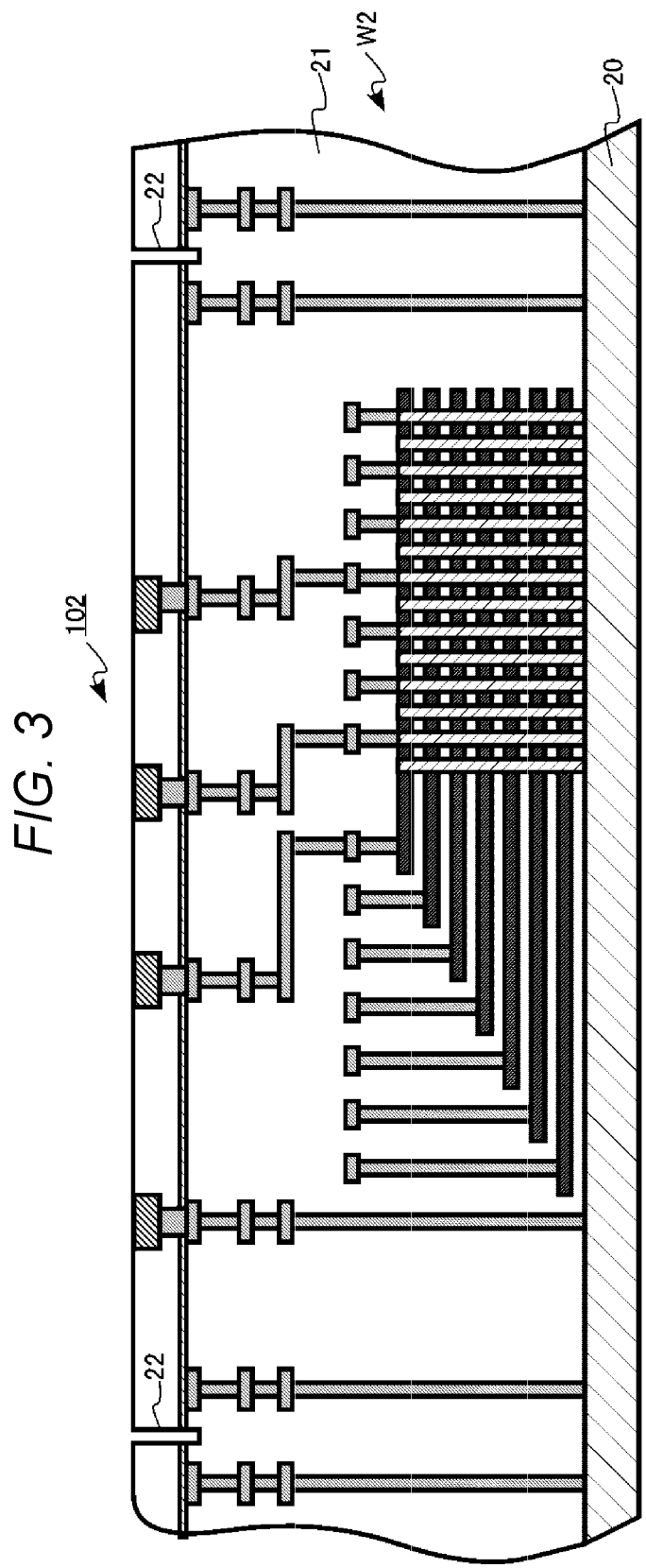

A second wafer W2 having a plurality of memory chips 102 is then produced (FIG. 3). On a surface of the second wafer W2, second recess portions 22 are formed.

Figure 4:
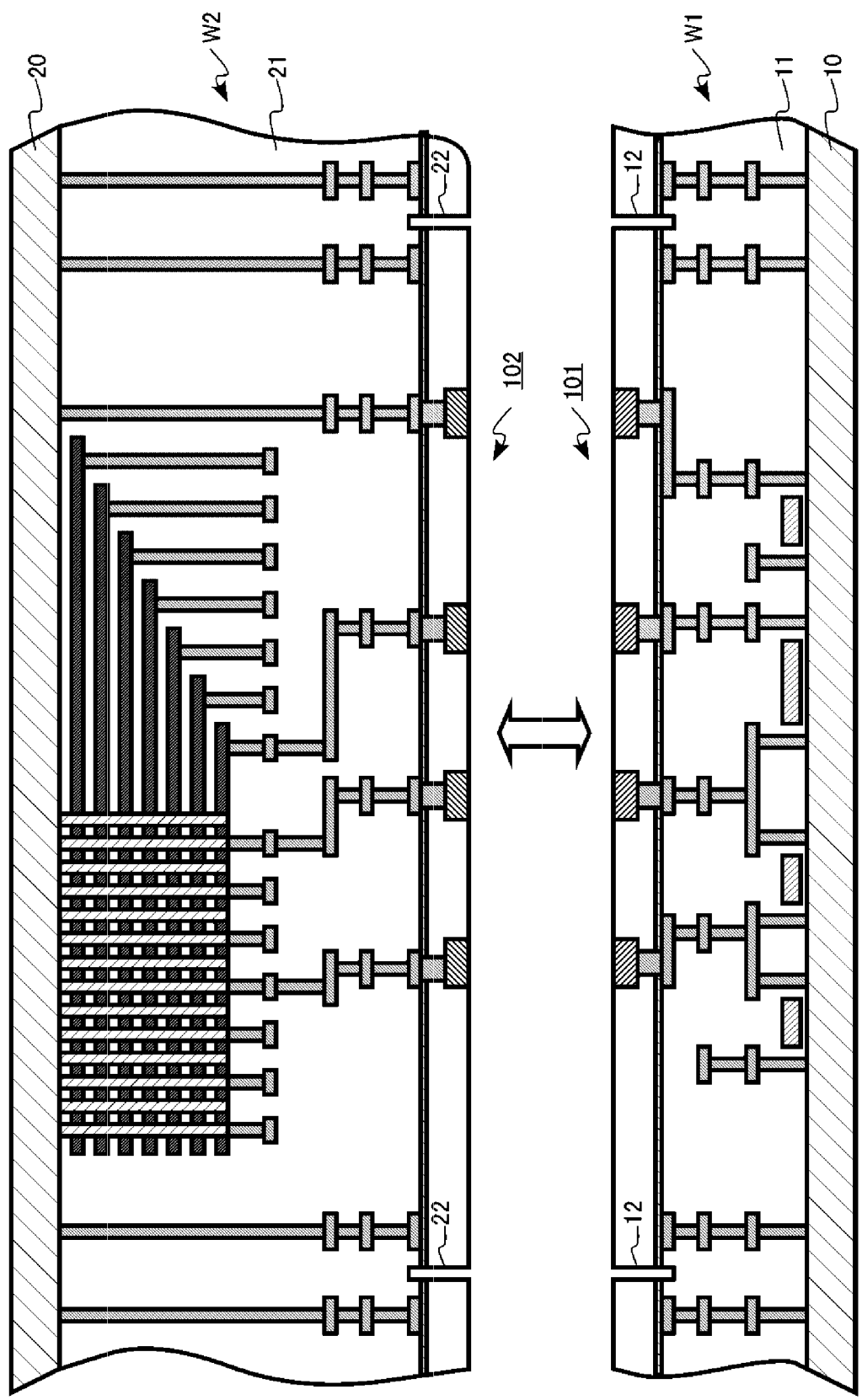
Figure 5:
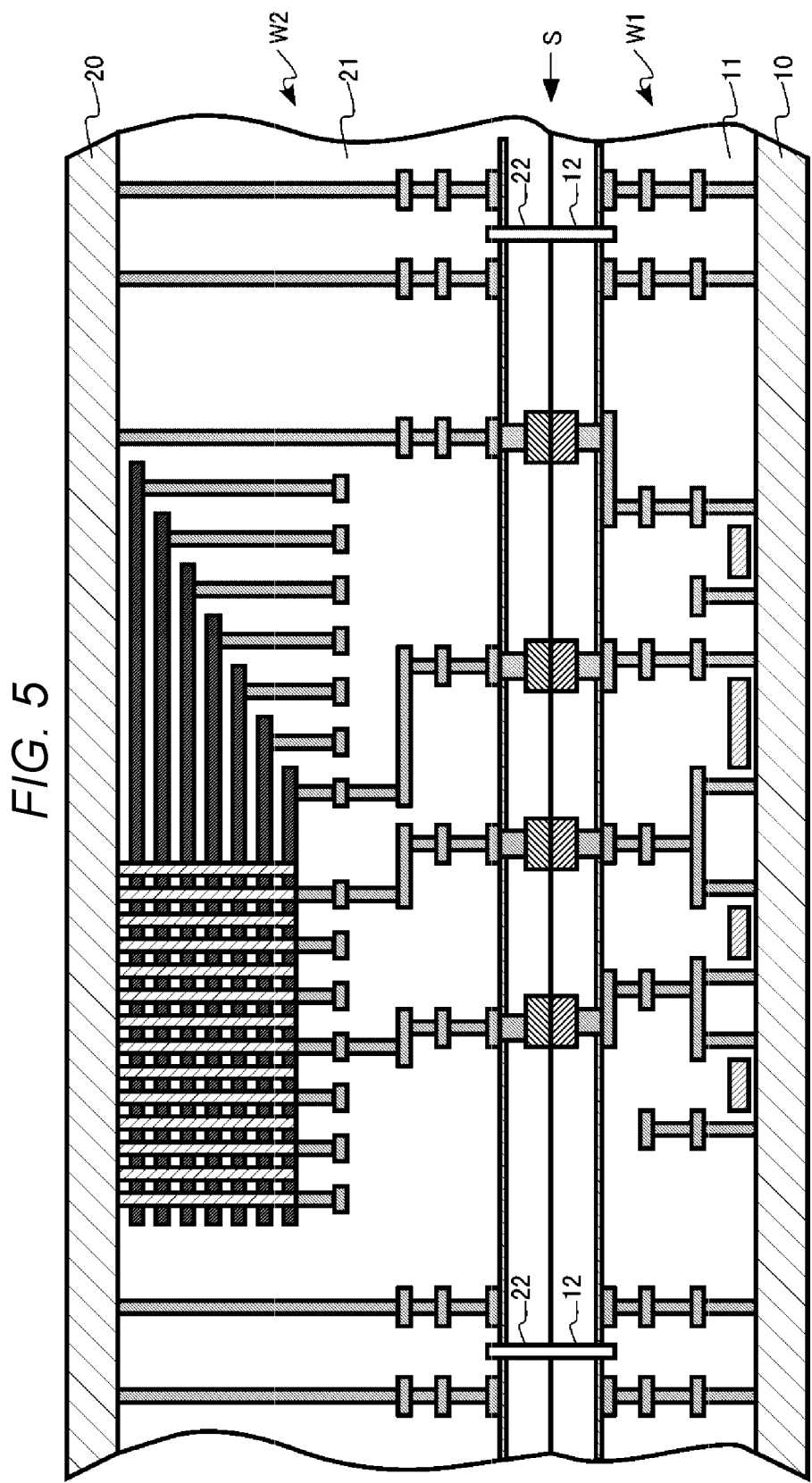

Subsequently, the first wafer W1 and the second wafer W2 are attached to each other under mechanical pressure (FIGS. 4 and 5). In this case, the first wafer W1 and the second wafer W2 are attached so that first recess portions 12 align with second recess portions 22. The first wafer W1 and the second wafer W2 are then annealed. The annealing temperature is, for example, 400° C. By this annealing, the first wafer W1 is bonded to the second wafer W2.

After the first wafer W1 is bonded to the second wafer W2, for example, the bonded wafers are cut by blade dicing. When the wafers are cut, a plurality of flash memories 100, in which each of the control chips 101 is bonded to each of the memory chips 102 as illustrated in FIG. 1, are produced.

Figure 6:
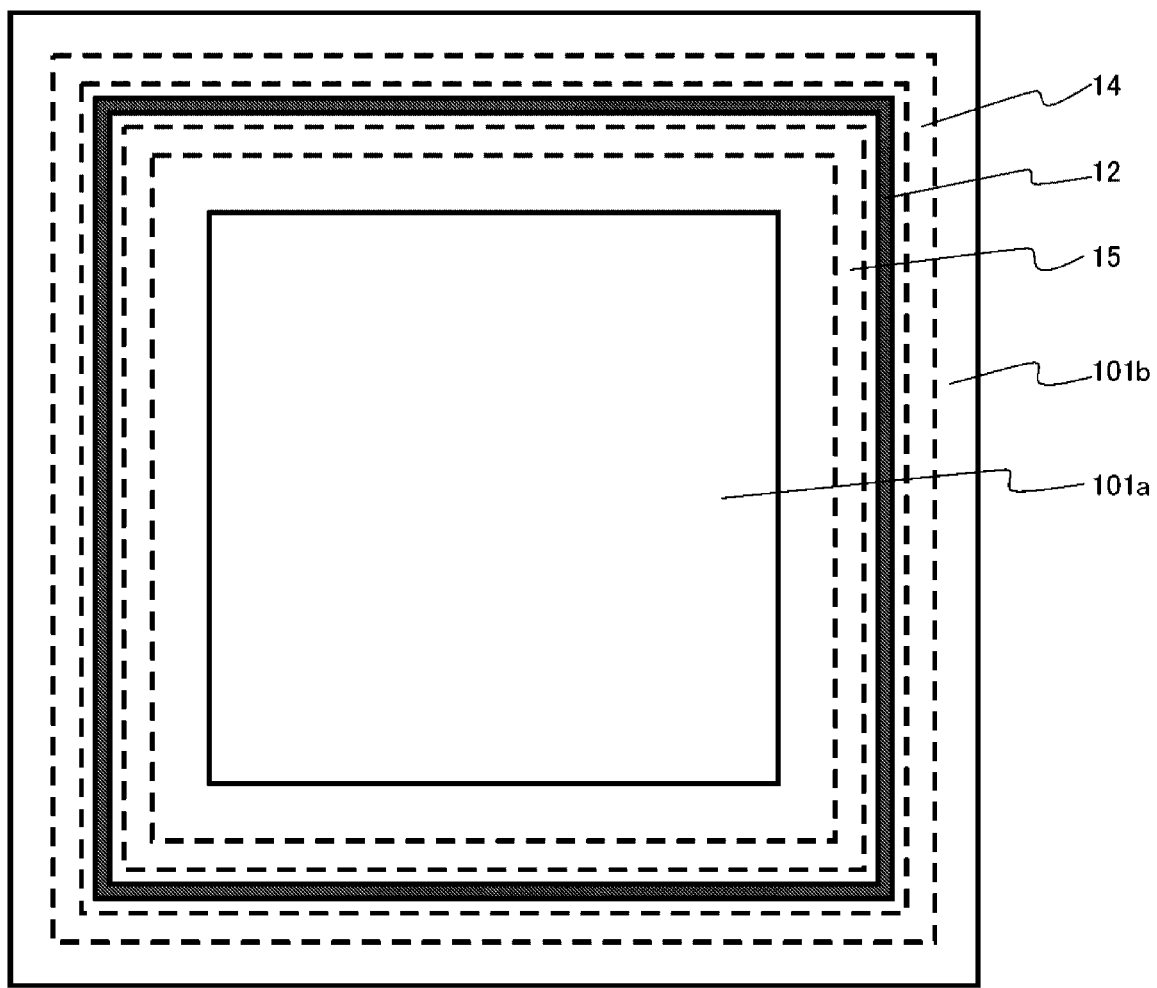
FIG. 6 is a schematic plan view of a control chip of a first embodiment.

FIG. 6 is a schematic plan view of the control chip 101 of the first embodiment. FIG. 6 represents a pattern layout of the control chip 101 when viewed from the sticking interface S.

The control chip 101 has the first element region 101a and the first peripheral region 101b. The first peripheral region 101b surrounds the first element region 101a.

Figure 7:
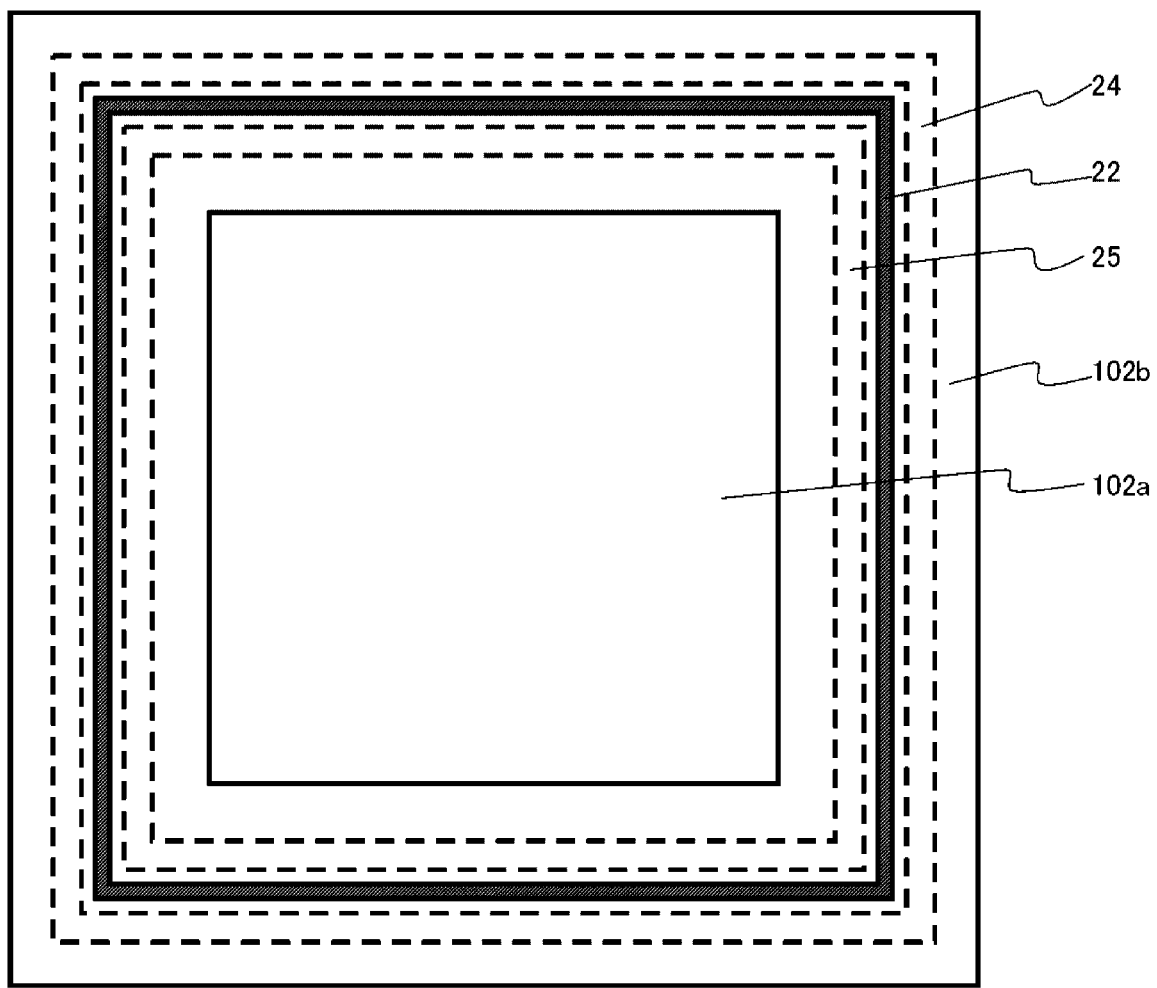
FIG. 7 is a schematic plan view of a memory chip of a first embodiment.

FIG. 7 is a schematic plan view of the memory chip 102 of the first embodiment. FIG. 7 represents a pattern layout of the memory chip 102 when viewed from the sticking interface S.

The memory chip 102 has the second element region 102a and the second peripheral region 102b. The second peripheral region 102b surrounds the second element region 102a.

The control chip 101 has a function of controlling the memory chip 102.

At the first element region 101a of the control chip 101, the control circuit 16 is provided. The control circuit 16 includes a plurality of semiconductor elements such as transistors, and a multi-layer wiring layer that electrically connects the semiconductor element to the semiconductor element.

The thickness of the control chip 101 in a direction perpendicular to the sticking interface S (t1 in FIG. 1) is, for example, 1 µm or more and 5 µm or less.

At the first peripheral region 101b, a semiconductor element constituting the control circuit 16 is not provided.

The first semiconductor layer 10 is, for example, single crystal silicon.

The first interlayer region 11 is provided on a side of the memory chip 102 of the first semiconductor layer 10. The first interlayer region 11 is provided at the first element region 101a and the first peripheral region 101b. The first interlayer region 11 is provided between the first semiconductor layer 10 and the memory chip 102.

The first interlayer region 11 has a function of achieving electrical insulation of the plurality of semiconductor elements such as transistors, and the multi-layer wiring layer of the control circuit 16. The first interlayer region 11 includes, for example, silicon oxide.

The first recess portion 12 is provided at the first peripheral region 101b. The first recess portion 12 is provided on the side of the memory chip 102 of the first interlayer region 11. The first recess portion 12 is a groove formed on a surface of the first interlayer region 11. The first recess portion 12 is a part of the first interlayer region 11.

As illustrated in FIG. 6, the first recess portion 12 surrounds the first element region 101a. The first recess portion 12 has a circle shape that surrounds the first element region 101a.

The first metal pads 13 are provided at the first element region 101a. The first metal pads 13 are provided on the side of the memory chip 102 of the first interlayer region 11. The first metal pads 13 are provided in the first interlayer region 11. The first metal pads 13 are electrically connected to the control circuit 16.

The first metal pads 13 are in contact with the second metal pads 23. The first metal pads 13 have a function of electrically connecting the control chip 101 to the memory chip 102.

For example, the first metal pads 13 contain copper (Cu). For example, the first metal pads 13 are copper (Cu).

The first outer edge sealing structure 14 is provided at the first peripheral region 101b. The first outer edge sealing structure 14 is provided in the first interlayer region 11. The first interlayer region 11 is provided between the first outer edge sealing structure 14 and the sticking interface S. The first outer edge sealing structure 14 is in contact with the first semiconductor layer 10. A part of the first outer edge sealing structure 14 that is in contact with the first semiconductor layer 10 may be a silicide.

The first outer edge sealing structure 14 is a conductor. For example, the first outer edge sealing structure 14 is a metal. For example, the first outer edge sealing structure 14 is formed from the same material as a material for a contact plug and a wiring for the multi-layer wiring layer of the control circuit 16 at the same time as formation of the contact plug and the wiring.

As illustrated in FIG. 6, the first outer edge sealing structure 14 surrounds the first element region 101a. The first outer edge sealing structure 14 has a rectangular shape that encircles (surrounds) the first element region 101a.

The first outer edge sealing structure 14 has a function of stopping the extension of a crack from an end of the first peripheral region 101b to the first element region 101a when the wafers are diced to produce the flash memory 100.

The first inner edge sealing structure 15 is provided at the first peripheral region 101b. The first inner edge sealing structure 15 is provided in the first interlayer region 11. The first interlayer region 11 is provided between the first inner edge sealing structure 15 and the sticking interface S. The first inner edge sealing structure 15 is in contact with the first semiconductor layer 10. A part of the first inner edge sealing structure 15 that is in contact with the first semiconductor layer 10 may be a silicide.

The first inner edge sealing structure 15 is a conductor. For example, the first inner edge sealing structure 15 is a metal. For example, the first inner edge sealing structure 15 is formed from the same material as the material for the contact plug and the wiring for the multi-layer wiring layer of the control circuit 16 at the same time as formation of the contact plug and the wiring.

As illustrated in FIG. 6, the first inner edge sealing structure 15 surrounds the first element region 101a. The first inner edge sealing structure 15 has a rectangular shape that encircles (surrounds) the first element region 101a. The first inner edge sealing structure 15 is closer to the first element region 101a than the first outer edge sealing structure 14. The first inner edge sealing structure 15 is surrounded by the first outer edge sealing structure 14.

The first inner edge sealing structure 15 has a function of stopping the extension of a crack from an end of the first peripheral region 101b to the first element region 101a when the wafers are diced to produce the flash memory 100.

The first diffusion preventing layer 17 is provided in the first interlayer region 11. The first diffusion preventing layer 17 is provided between the sticking interface S and the first outer edge sealing structure 14 and between the sticking interface S and the first inner edge sealing structure 15.

The first diffusion preventing layer 17 has a function of preventing diffusion of a metal used for the multi-layer wiring layer, and especially, copper (Cu). The first diffusion preventing layer 17 has a function of preventing absorption of moisture by the first interlayer region 11.

For example, the first diffusion preventing layer 17 contains silicon (Si) and nitrogen (N). For example, the first diffusion preventing layer 17 contains silicon nitride and nitrogen-doped silicon carbide.

At the second element region 102a of the memory chip 102, the memory cell array 26 is provided. In the memory cell array 26, a plurality of memory cells are three-dimensionally layered and arranged. By the plurality of memory cells that are three-dimensionally arranged, the flash memory 100 can have large capacity.

The thickness of the memory chip 102 in the direction perpendicular to the sticking interface S (t2 in FIG. 1) is, for example, 5 µm or more and 20 µm or less.

At the second peripheral region 102b, the memory cell array 26 is not provided.

The second semiconductor layer 20 is, for example, single crystal silicon.

The second interlayer region 21 is provided on a side of the control chip 101 of the second semiconductor layer 20. The second interlayer region 21 is provided at the second element region 102a and the second peripheral region 102b.

The second interlayer region 21 is in contact with the first interlayer region 11. The second interlayer region 21 is provided between the second semiconductor layer 20 and the control chip 101.

The second interlayer region 21 has a function of achieving electrical insulation of the memory cell array 26. The second interlayer region 21 includes, for example, silicon oxide.

The second recess portion 22 is provided at the second peripheral region 102b. The second recess portion 22 is provided on the side of the control chip 101 of the second interlayer region 21. The second recess portion 22 is a groove formed on a surface of the second interlayer region 21. The second recess portion 22 is a part of the second interlayer region 21.

As illustrated in FIG. 7, the second recess portion 22 surrounds the second element region 102a. The second recess portion 22 has a rectangular shape that encircles (surrounds) the second element region 102a.

The second recess portion 22 faces the first recess portion 12. The first recess portion 12 is overlapped with the second recess portion 22, and thus the cavity 30 is formed.

A void region is formed by the first recess portion 12 and the second recess portion 22. A gas can be present in this void region. In the void region that is formed by the joining of the first recess portion 12 and the second recess portion 22, no solid materials are present. This void region is referred to as a cavity 30. The cavity 30 may contain a gas.

The cavity 30 is provided in a peripheral region of the flash memory 100. The peripheral region of the flash memory 100 includes the first peripheral region 101b and the second peripheral region 102b. The cavity 30 surrounds an element region of the flash memory 100. The element region of the flash memory 100 includes the first element region 101a and the second element region 102a. The cavity 30 has a rectangular shape that encircles (surrounds) the element region of the flash memory 100.

The second metal pads 23 are provided in the second element region 102a. The second metal pads 23 are provided on the side of the control chip 101 of the second interlayer region 21. The second metal pads 23 are provided in the second interlayer region 21. The second metal pads 23 are electrically connected to the memory cell array 26.

The second metal pads 23 are in contact with the first metal pads 13. The second metal pads 23 have a function of electrically connecting the memory chip 102 to the control chip 101.

For example, the second metal pads 23 contain copper (Cu). For example, the second metal pads 23 are copper (Cu).

The second outer edge sealing structure 24 is provided at the second peripheral region 102b. The second outer edge sealing structure 24 is provided in the second interlayer region 21. The second interlayer region 21 is provided between the second outer edge sealing structure 24 and the sticking interface S. The second outer edge sealing structure 24 is in contact with the second semiconductor layer 20.

The second outer edge sealing structure 24 is a conductor. For example, the second outer edge sealing structure 24 is formed from the same material as the material for the memory cell array 26 and the contact plug and the wiring for the multi-layer wiring layer on the memory cell array 26 at the same time as formation of the memory cell array 26, the contact plug, and the wiring.

As illustrated in FIG. 7, the second outer edge sealing structure 24 surrounds the second element region 102a. The second outer edge sealing structure 24 has a rectangular shape that (encircles) surrounds the second element region 102a.

The second outer edge sealing structure 24 has a function of stopping the extension of a crack from an end of the second peripheral region 102b to the second element region 102a when the wafers are diced to produce the flash memory 100.

The second inner edge sealing structure 25 is provided in the second peripheral region 102b. The second inner edge sealing structure 25 is provided in the second interlayer region 21. The second interlayer region 21 is provided between the second inner edge sealing structure 25 and the sticking interface S. The second inner edge sealing structure 25 is in contact with the second semiconductor layer 20.

The second inner edge sealing structure 25 is a conductor. For example, the second inner edge sealing structure 25 is formed from the same material as the material for the memory cell array 26 and the contact plug and the wiring for the multi-layer wiring layer on the memory cell array 26 at the same time as formation of the memory cell array 26, the contact plug, and the wiring.

As illustrated in FIG. 7, the second inner edge sealing structure 25 surrounds the second element region 102a. The second inner edge sealing structure 25 has a rectangular shape that encircles (surrounds) the second element region 102a. The second inner edge sealing structure 25 is closer to the second element region 102a than the second outer edge sealing structure 24. The second inner edge sealing structure 25 is surrounded by the second outer edge sealing structure 24.

The second inner edge sealing structure 25 has a function of stopping the extension of a crack from an end of the second peripheral region 102b to the second element region 102a when the wafers are diced to produce the flash memory 100.

The second diffusion preventing layer 27 is provided in the second interlayer region 21. The second diffusion preventing layer 27 is provided between the sticking interface S and the second outer edge sealing structure 24 and between the sticking interface S and the second inner edge sealing structure 25.

The second diffusion preventing layer 27 has a function of preventing diffusion of a metal used for the multi-layer wiring layer, and especially, copper (Cu). The second diffusion preventing layer 27 has a function of preventing absorption of moisture by the second interlayer region 21.

For example, the second diffusion preventing layer 27 contains silicon (Si) and nitrogen (N). For example, the second diffusion preventing layer 27 contains silicon nitride and nitrogen-doped silicon carbide.

Figure 8:
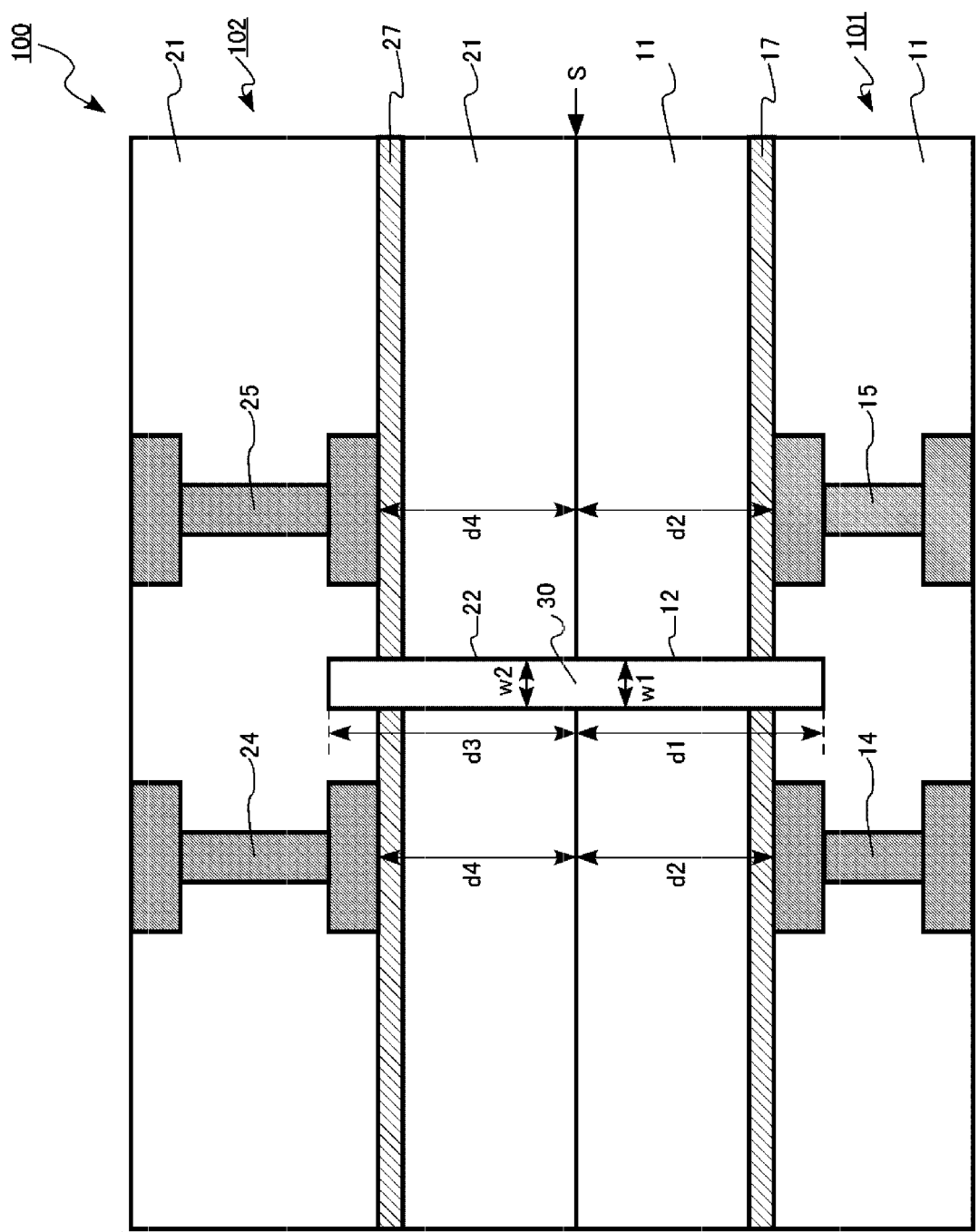
FIG. 8 is an enlarged schematic cross-sectional view of a semiconductor device of a first embodiment.

FIG. 8 is an enlarged schematic cross-sectional view of the semiconductor device of the first embodiment. FIG. 8 is the enlarged schematic cross-sectional view in a vicinity of the cavity 30 formed by the first recess portion 12 and the second recess portion 22. In FIG. 8, a side of the first element region 101a is right.

The first recess portion 12 is provided between the first outer edge sealing structure 14 and the first inner edge sealing structure 15. The distance between the sticking interface S and a bottom surface of the first recess portion 12 (d1 in FIG. 8) is greater than the distance between the sticking interface S and the first outer edge sealing structure 14 and the distance between the sticking interface S and the first inner edge sealing structure 15 (d2 in FIG. 8). That is, the depth of the first recess portion 12 relative to the sticking interface S is deeper than the depth to the first outer edge sealing structure 14 and the depth to the first inner edge sealing structure 15 relative to the sticking interface S. The first recess portion 12 is passed through the first diffusion preventing layer 17.

The width of the first recess portion 12 (w1 in FIG. 8) is, for example, 0.5 μm or more and 10 μm or less. The aspect ratio (d1/w1) of the first recess portion 12 is, for example, 3 or more.

The second recess portion 22 is provided between the second outer edge sealing structure 24 and the second inner edge sealing structure 25. The distance between the sticking interface S and a bottom surface of the second recess portion 22 (d3 in FIG. 8) is greater than the distance between the sticking interface S and the second outer edge sealing structure 24 and the distance between the sticking interface S and the second inner edge sealing structure 25 (d4 in FIG. 8). That is, the depth of the second recess portion 22 relative to the sticking interface S is deeper than the depth to the second outer edge sealing structure 24 and the depth to the second inner edge sealing structure 25 relative to the sticking interface S. The second recess portion 22 is passed through the second diffusion preventing layer 27.

The width of the second recess portion 22 (w2 in FIG. 8) is, for example, 0.5 μm or more and 10 μm or less. The aspect ratio (d3/w2) of the second recess portion 22 is, for example, 3 or more.

The cavity 30 is formed by the first recess portion 12 and the second recess portion 22. An end of the cavity 30 is on a side of the first semiconductor layer 10 rather than the first outer edge sealing structure 14 and the first inner edge sealing structure 15. Another end of the cavity 30 is on aside of the second semiconductor layer 20 rather than the second outer edge sealing structure 24 and the second inner edge sealing structure 25.

Next, actions and effects of the semiconductor device of the first embodiment will be described.

Figure 9:
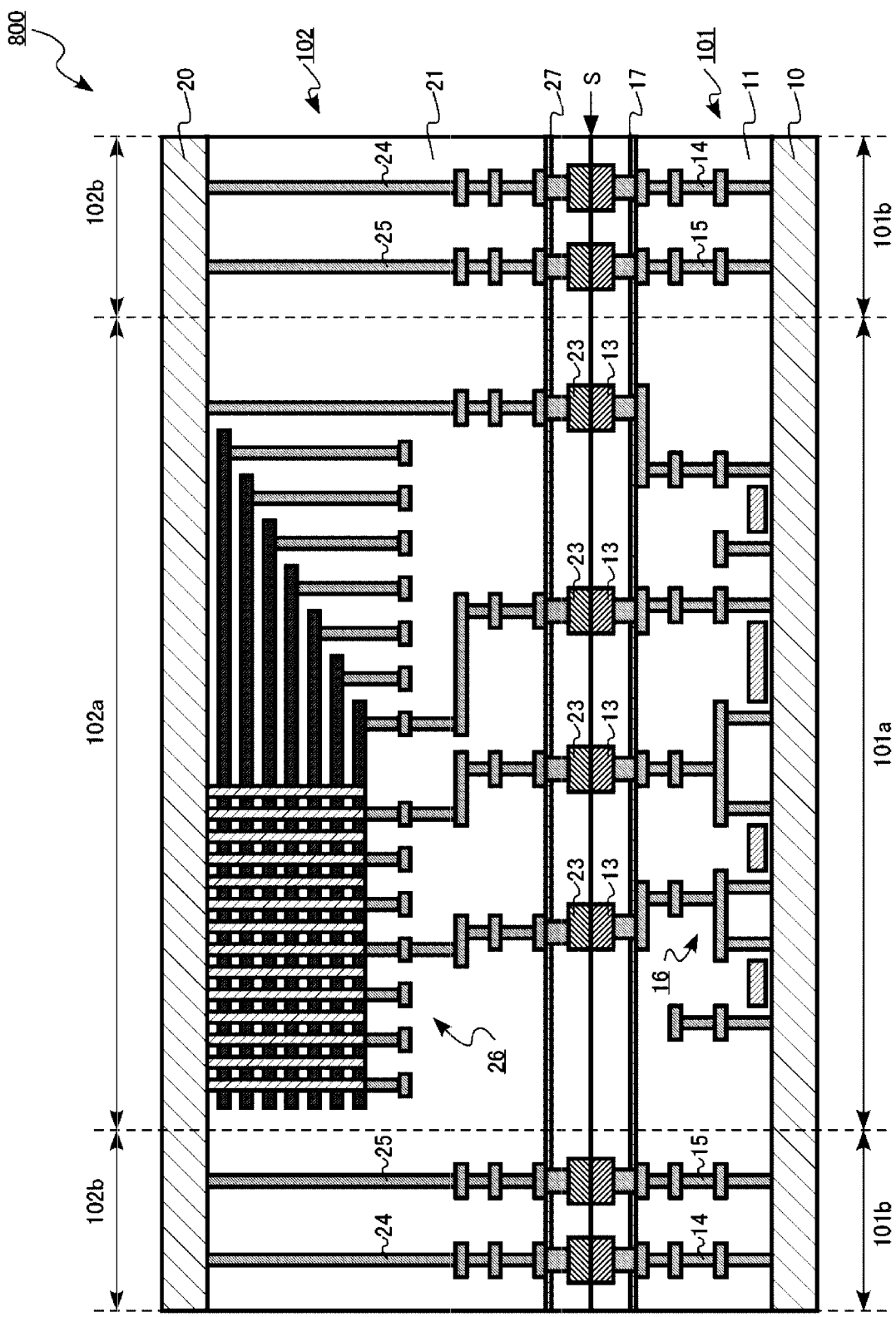
FIG. 9 is a schematic cross-sectional view of a semiconductor device of a first comparative example.

FIG. 9 is a schematic cross-sectional view of a semiconductor device of a first comparative example. The semiconductor device of the first comparative example is a flash memory 800.

The flash memory 800 of the first comparative example is different from the flash memory 100 of the first embodiment in that the cavity 30 is not provided. The flash memory 800 is also different from the flash memory 100 in that the first outer edge sealing structure 14 is in contact with the second outer edge sealing structure 24 and the first inner edge sealing structure 15 is in contact with the second inner edge sealing structure 25. The flash memory 800 is further different from the flash memory 100 in that the first outer edge sealing structure 14 and the first inner edge sealing structure 15 are each provided with the first metal pad 13, and the second outer edge sealing structure 24 and the second inner edge sealing structure 25 are each provided with the second metal pad 23.

When the first wafer W1 having a plurality of control chips 101 is produced, the first metal pad 13 is formed by planarizing a deposited metal film by a chemical mechanical polishing (CMP) method. In the first comparative example, it is necessary that the first metal pad 13 at an uppermost portion of the first outer edge sealing structure 14 and the first metal pad 13 at an uppermost portion of the first inner edge sealing structure 15 be formed into a circle at the first peripheral region 101b.

Since the first metal pad 13 is a circle and remains at the first peripheral region 101b, the flattening properties of a surface of the first wafer W1 are deteriorated during CMP. Similarly, the flattening properties of a surface of the second wafer W2 having a plurality of memory chips 102 are deteriorated. Therefore, when the first wafer W1 is attached to the second wafer W2, air bubbles are not removed between the first wafer W1 and the second wafer W2, and attachment is difficult.

Figure 10:
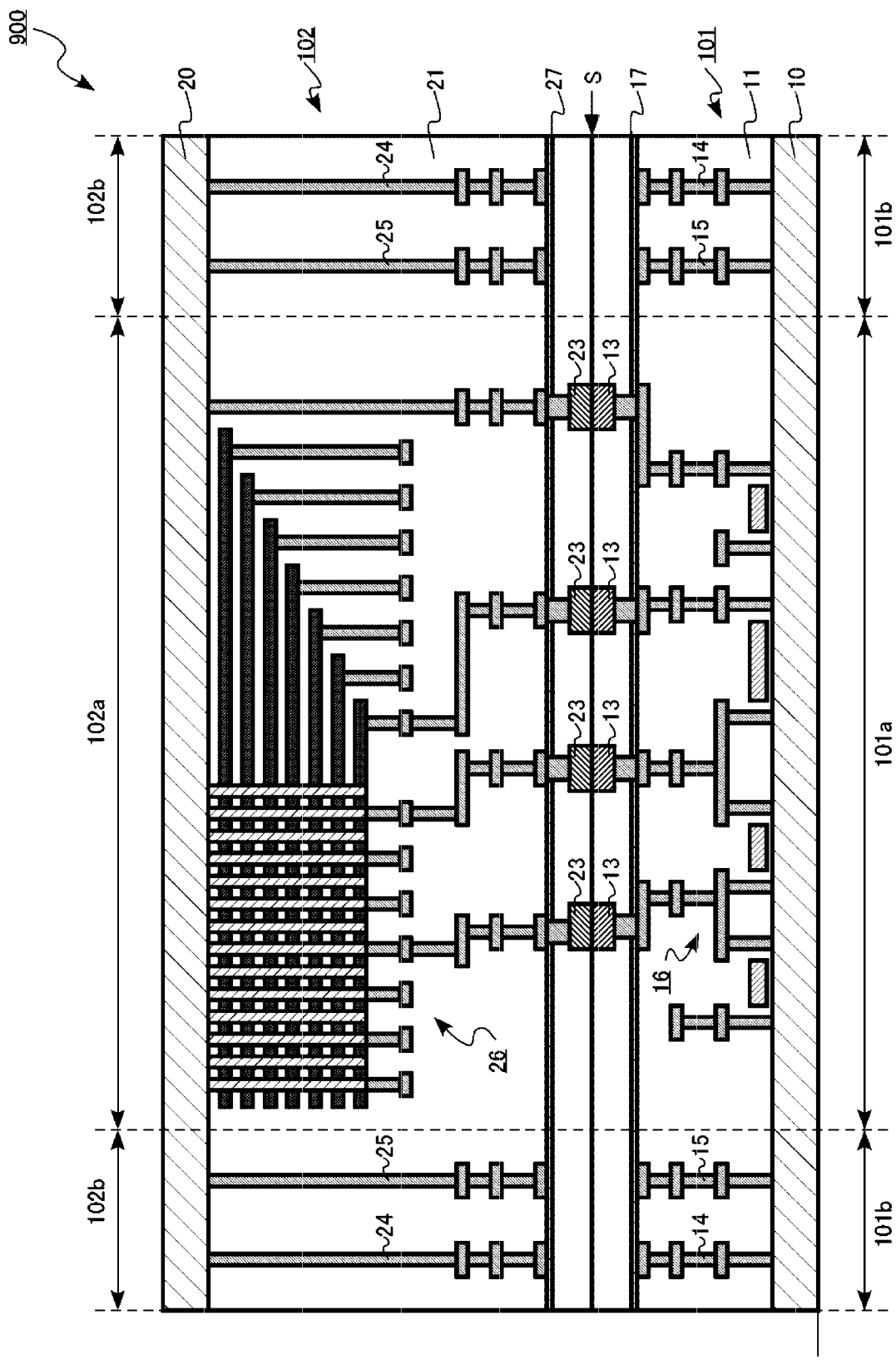
FIG. 10 is a schematic cross-sectional view of a semiconductor device of a second comparative example.

FIG. 10 is a schematic cross-sectional view of a semiconductor device of a second comparative example. The semiconductor device of the second comparative example is a flash memory 900.

The flash memory 900 of the second comparative example is different from the flash memory 100 of the first embodiment in that the cavity 30 is not provided. In the flash memory 900, which is different from the flash memory 800 of the first comparative example, the first outer edge sealing structure 14 and the first inner edge sealing structure 15 are both not provided with the first metal pad 13, and the second outer edge sealing structure 24 and the second inner edge sealing structure 25 are both not provided with the second metal pad 23.

In the control chip 101, the first outer edge sealing structure 14 and the first inner edge sealing structure 15 are both not provided with the first metal pad 13. Therefore, when the first wafer W1 having a plurality of control chips 101 is produced, the flattening properties of the surface of the first wafer W1 can be achieved. Similarly, the flattening properties of the surface of the second wafer W2 having a plurality of memory chips 102 can be achieved. Accordingly, when the first wafer W1 is attached to the second wafer W2, air bubbles are unlikely to remain between the first wafer W1 and the second wafer W2 an attachment is made easier.

After the first wafer W1 is attached to the second wafer W2, the wafers are cut by blade dicing, for example. When the wafers are cut, chips of flash memory 900, in which the control chip 101 is attached to the memory chip 102, are produced.

When the wafers are diced, a crack that extends from an end of the first peripheral region 101b to the first element region 101a may be caused. Similarly, a crack that extends from an end of the second peripheral region 102b to the second element region 102a may be caused. When the cracks reach the first element region 101a and the second element region 102a, the flash memory 900 becomes a defective product.

In the flash memory 900, the first outer edge sealing structure 14 is separated from the second outer edge sealing structure 24. The first inner edge sealing structure 15 is separated from the second inner edge sealing structure 25.

Therefore, a crack may be caused during dicing between the first outer edge sealing structure 14 and the second outer edge sealing structure 24 or between the first inner edge sealing structure 15 and the second inner edge sealing structure 25. As a result, the crack may reach the first element region 101a or the second element region 102a. Thus, the flash memory 900 may become a defective product.

In the flash memory 100, the cavity 30 extends between the first peripheral region 101b and the second peripheral region 102b. Due to the cavity 30, during dicing, the progression of a crack between the first outer edge sealing structure 14 and the second outer edge sealing structure 24 and between the first inner edge sealing structure 15 and the second inner edge sealing structure 25 is hindered.

When a crack that extends from the end of the first peripheral region 101b or the end of the second peripheral region 102b reaches the cavity 30, the direction of the crack can be changed to a depth direction of the cavity 30, that is, a direction perpendicular to the sticking interface S, and the crack is caused. Therefore, extension of the crack to the first element region 101a and the second element region 102a is hindered. According to the flash memory 100 of the first embodiment, a defect caused by dicing can be decreased as compared to flash memory 900.

From the viewpoint of preventing the progression of a crack, it is preferable that the first element region 101a and the second element region 102a be fully encircled (surrounded) by the cavity 30. That is, it is preferable that the cavity 30 be continuous. Therefore, it is preferable that the first recess portion 12 has an enclosed shape, and the second recess portion 22 has an enclosed shape.

From the viewpoint of preventing the progression of a crack, it is preferable that the end of the cavity 30 be on a side of the first semiconductor layer 10 rather than the first outer edge sealing structure 14 and the first inner edge sealing structure 15. Therefore, it is preferable that the distance between the sticking interface S and the bottom surface of the first recess portion 12 (d1 in FIG. 8) be greater than the distance between the sticking interface S and the first outer edge sealing structure 14 and the distance between the sticking interface S and the first inner edge sealing structure 15 (d2 in FIG. 8).

From the viewpoint of preventing the progression of a crack, it is preferable that the other end of the cavity 30 be on a side of the second semiconductor layer 20 rather than the second outer edge sealing structure 24 and the second inner edge sealing structure 25. Therefore, it is preferable that the distance between the sticking interface S and the bottom surface of the second recess portion 22 (d3 in FIG. 8) be greater than the distance between the sticking interface S and the second outer edge sealing structure 24 and the distance between the sticking interface S and the second inner edge sealing structure 25 (d4 in FIG. 8).

From the viewpoint of preventing the progression of a crack, it is preferable that the aspect ratio ((d1+d3)/w1) of the cavity 30 be large. Therefore, it is preferable that the aspect ratio (d1/w1) of the first recess portion 12 and the aspect ratio (d3/w2) of the second recess portion 22 be 3 or more.

From the viewpoint of preventing the progression of a crack, it is preferable that the width of the first recess portion 12 (w1 in FIG. 8) and the width of the second recess portion 22 (w2 in FIG. 5) be 0.5 μm or more.

From the viewpoint of preventing an increase in chip area of the flash memory 100, it is preferable that the width of the first recess portion 12 (w1 in FIG. 5) and the width of the second recess portion 22 (w2 in FIG. 8) be 10 μm or less.

According to the first embodiment, a semiconductor device that decreases defects caused by dicing can be provided.

Second Embodiment

A semiconductor device of a second embodiment is different from the semiconductor device of the first embodiment in that a plurality of first recess portions are provided.

The semiconductor device of the second embodiment is a flash memory 200. The flash memory 200 is a three-dimensional NAND flash memory in which a memory cell is three-dimensionally arranged.

Figure 11:
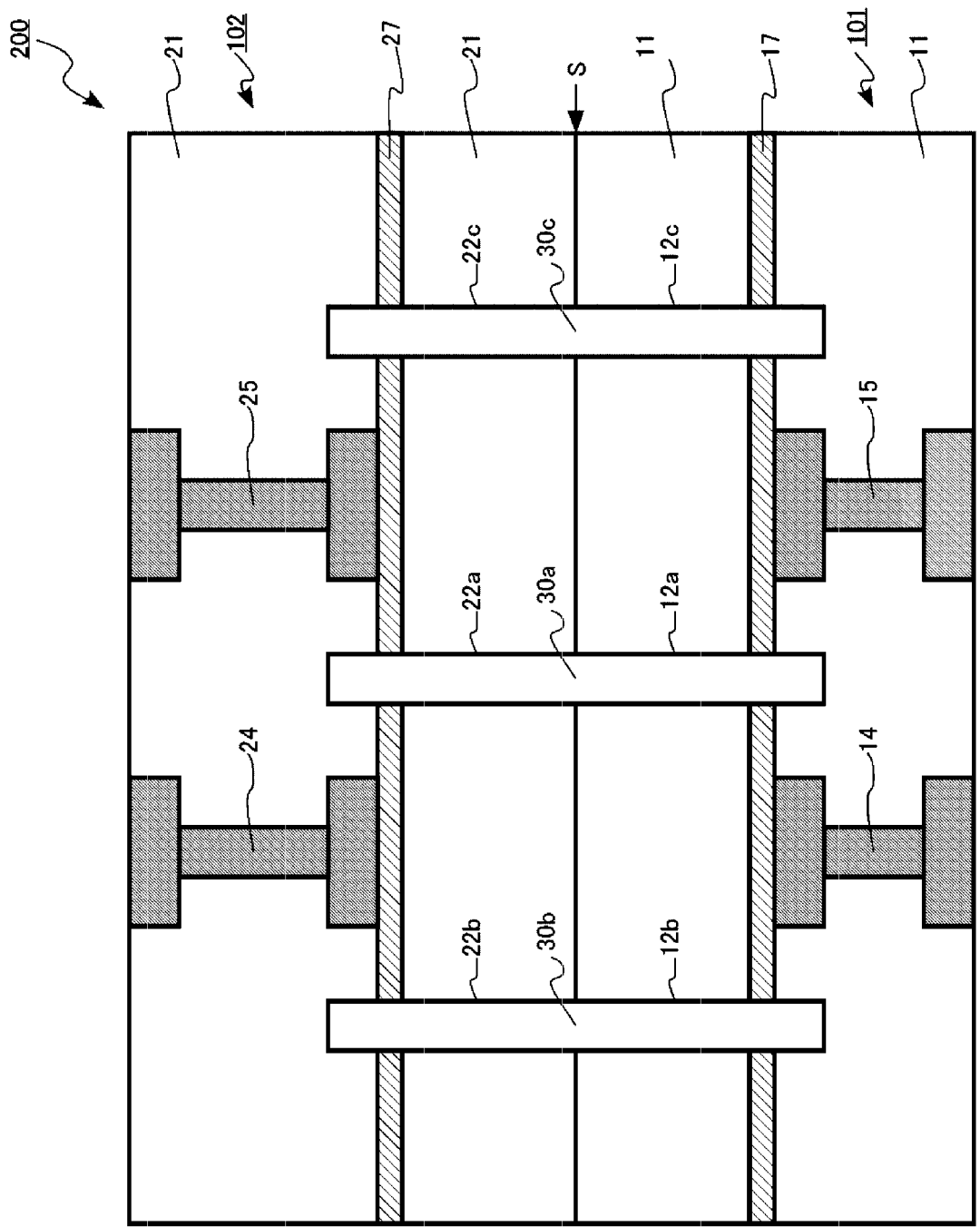
FIG. 11 is an enlarged schematic cross-sectional view of a semiconductor device of a second embodiment.

FIG. 11 is an enlarged schematic cross-sectional view of the semiconductor device of the second embodiment. FIG. 11 is a cross-sectional view corresponding to FIG. 8 that is based on the first embodiment. In FIG. 11, the side of the first element region 101a is right.

The first interlayer region 11 includes a first recess portion 12a, a first recess portion 12b, and a first recess portion 12c. The second interlayer region 21 includes a second recess portion 22a, a second recess portion 22b, and a second recess portion 22c.

The flash memory 200 includes three cavities, that is, cavities 30a, 30b, and 30c. Since the flash memory 200 includes the three cavities, the progression of a crack can be further hindered as compared with a case where just one cavity is provided.

According to the second embodiment, a semiconductor device that decreases defects caused by dicing can be provided.

Third Embodiment

A semiconductor device of a third embodiment is different from the semiconductor device of the first embodiment in that the first conductor is exposed to a bottom surface of a first recess portion.

The semiconductor device of the third embodiment is a flash memory 300. The flash memory 300 is a three-dimensional NAND flash memory in which a memory cell is three-dimensionally arranged.

Figure 12:
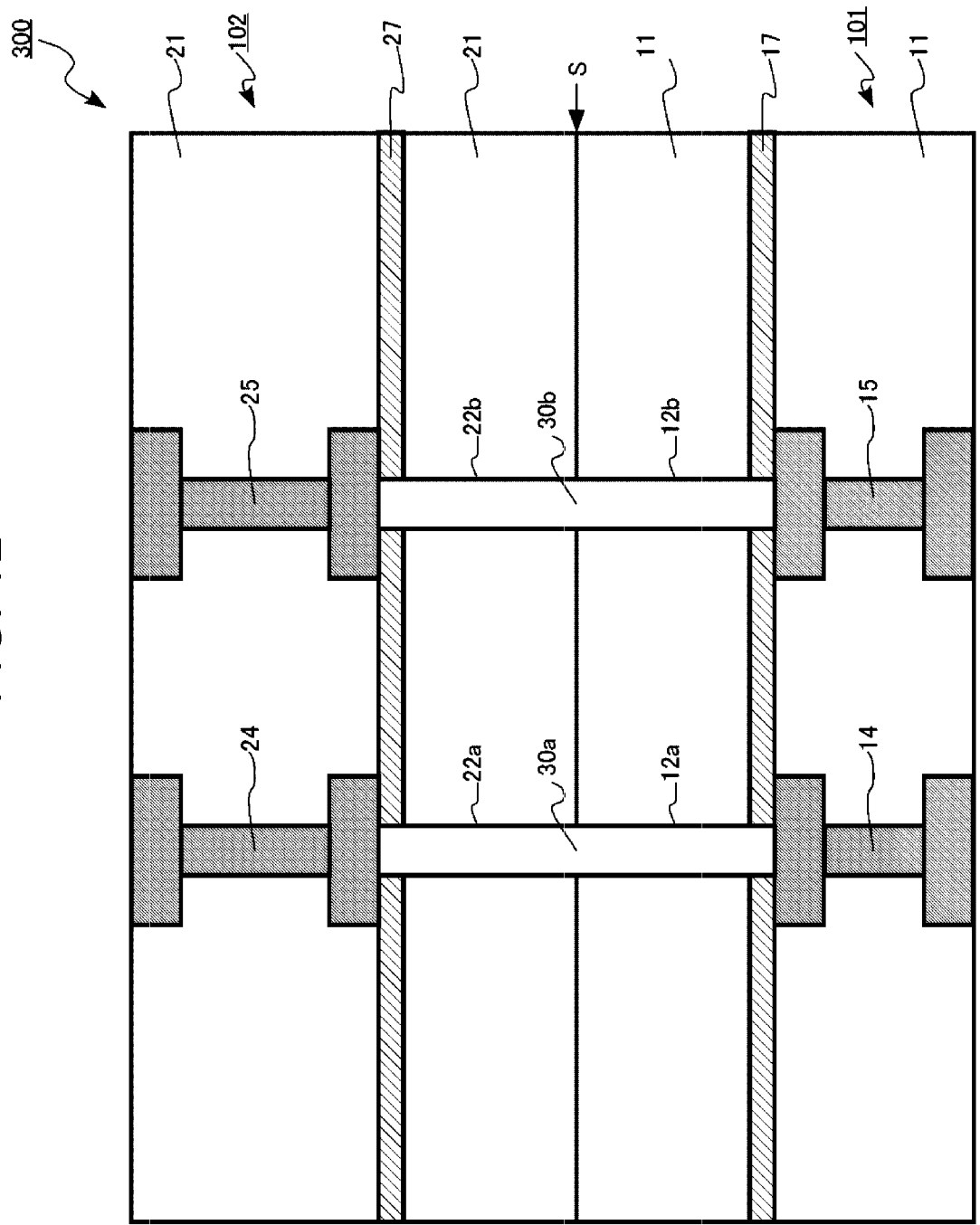
FIG. 12 is an enlarged schematic cross-sectional view of a semiconductor device of a third embodiment.

FIG. 12 is an enlarged schematic cross-sectional view of the semiconductor device of the third embodiment. FIG. 12 is a cross-sectional view corresponding to FIG. 8 that is based on the first embodiment. In FIG. 12, the side of the first element region 101a is right.

The first interlayer region 11 includes the first recess portion 12a, and the first recess portion 12b. The second interlayer region 21 includes the second recess portion 22a, and the second recess portion 22b.

The first outer edge sealing structure 14 is exposed to a bottom surface of the first recess portion 12a. The first inner edge sealing structure 15 is exposed to a bottom surface of the first recess portion 12b.

The second outer edge sealing structure 24 is exposed to a bottom surface of the second recess portion 22a. The second inner edge sealing structure 25 is exposed to a bottom surface of the second recess portion 22b.

In the flash memory 300, the depth is easily controlled when the first recess portion 12a and the first recess portion 12b are formed. The depth is easily controlled when the second recess portion 22a and the second recess portion 22b are formed.

According to the third embodiment, a semiconductor device that decreases defects caused by dicing can be provided.

Fourth Embodiment

A semiconductor device of a fourth embodiment is different from the semiconductor device of the first embodiment in that the distance between the sticking interface and the bottom surface of the first recess portion is less than the distance between the sticking interface and the first insulating layer.

The semiconductor device of the fourth embodiment is a flash memory 400. The flash memory 400 is a three-dimensional NAND flash memory in which a memory cell is three-dimensionally arranged.

Figure 13:
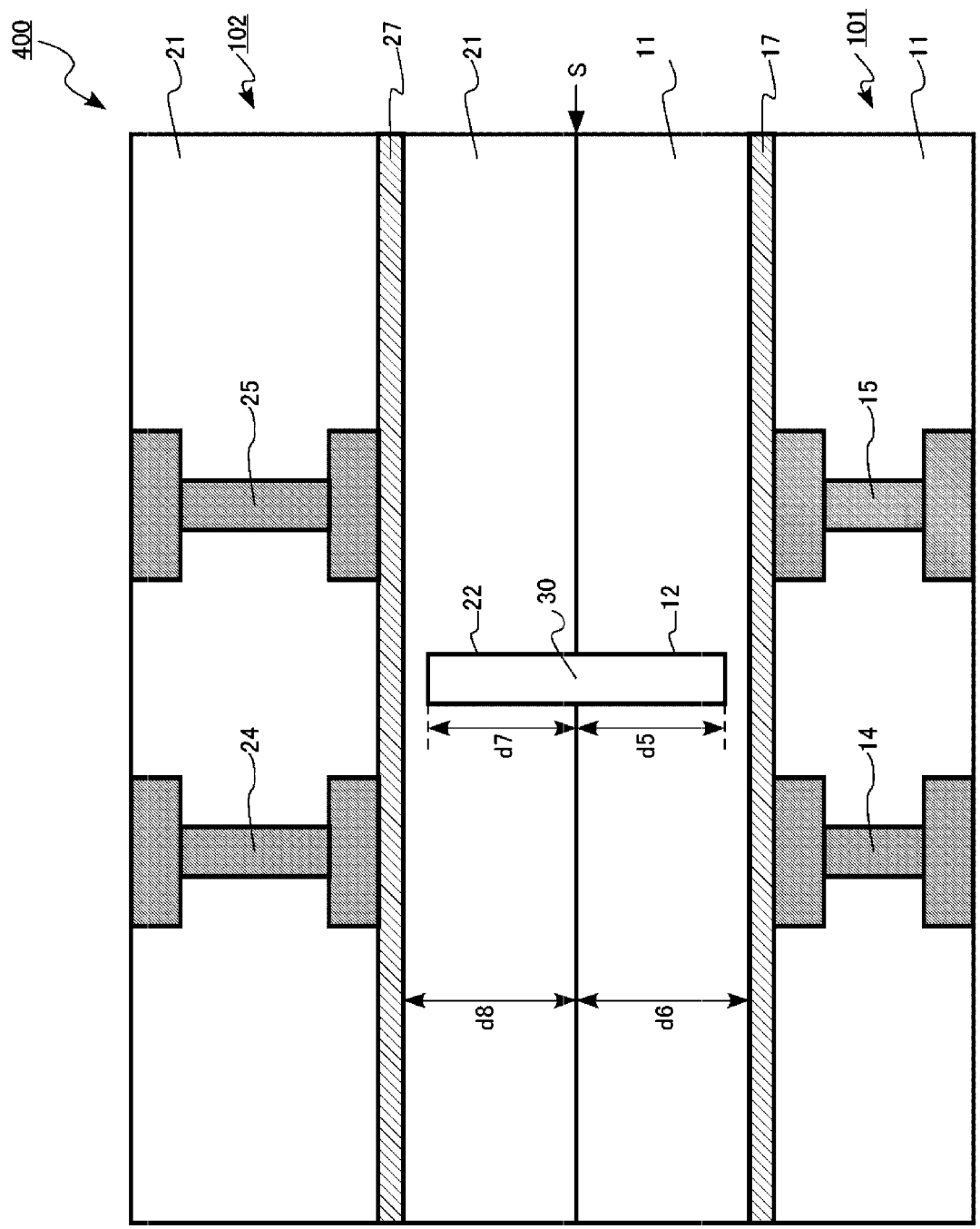
FIG. 13 is an enlarged schematic cross-sectional view of a semiconductor device of a fourth embodiment.

FIG. 13 is an enlarged schematic cross-sectional view of the semiconductor device of the fourth embodiment. FIG. 13 is a cross-sectional view corresponding to FIG. 8 that is based on the first embodiment. In FIG. 13, the side of the first element region 101a is right.

The distance between the sticking interface S and the bottom surface of the first recess portion 12 (d5 in FIG. 13) is less than the distance between the sticking interface S and the first diffusion preventing layer 17 (d6 in FIG. 13). The first recess portion 12 is not passed through the first diffusion preventing layer 17.

The distance between the sticking interface S and the bottom surface of the second recess portion 22 (d7 in FIG. 13) is less than the distance between the sticking interface S and the second diffusion preventing layer 27 (d8 in FIG. 13). The second recess portion 22 is not passed through the second diffusion preventing layer 27.

In the flash memory 400, the first recess portion 12 is not passed through the first diffusion preventing layer 17. Therefore, absorption of moisture by the first interlayer region 11 through the first recess portion 12 can be prevented. In particular, the absorption of moisture by the first interlayer region 11 on the side of the first semiconductor layer 10 of the first diffusion preventing layer 17 can be prevented.

The second recess portion 22 is not passed through the second diffusion preventing layer 27. Therefore, absorption of moisture by the second interlayer region 21 through the second recess portion 22 can be prevented. In particular, the absorption of moisture by the second interlayer region 21 on the side of the second semiconductor layer 20 of the second diffusion preventing layer 27 can be prevented.

Accordingly, the reliability of the flash memory 400 is improved.

According to the fourth embodiment, a semiconductor device that decreases defects caused by dicing can be provided. A semiconductor device of the fourth embodiment can also have improved reliability since moisture absorption is limited.

Fifth Embodiment

A semiconductor device of a fifth embodiment is different from the semiconductor devices of the first and second embodiments in that a plurality of first recess portions having different shapes are provided.

The semiconductor device of the fifth embodiment is a flash memory 500. The flash memory 500 is a three-dimensional NAND flash memory in which a memory cell is three-dimensionally arranged.

Figure 14:
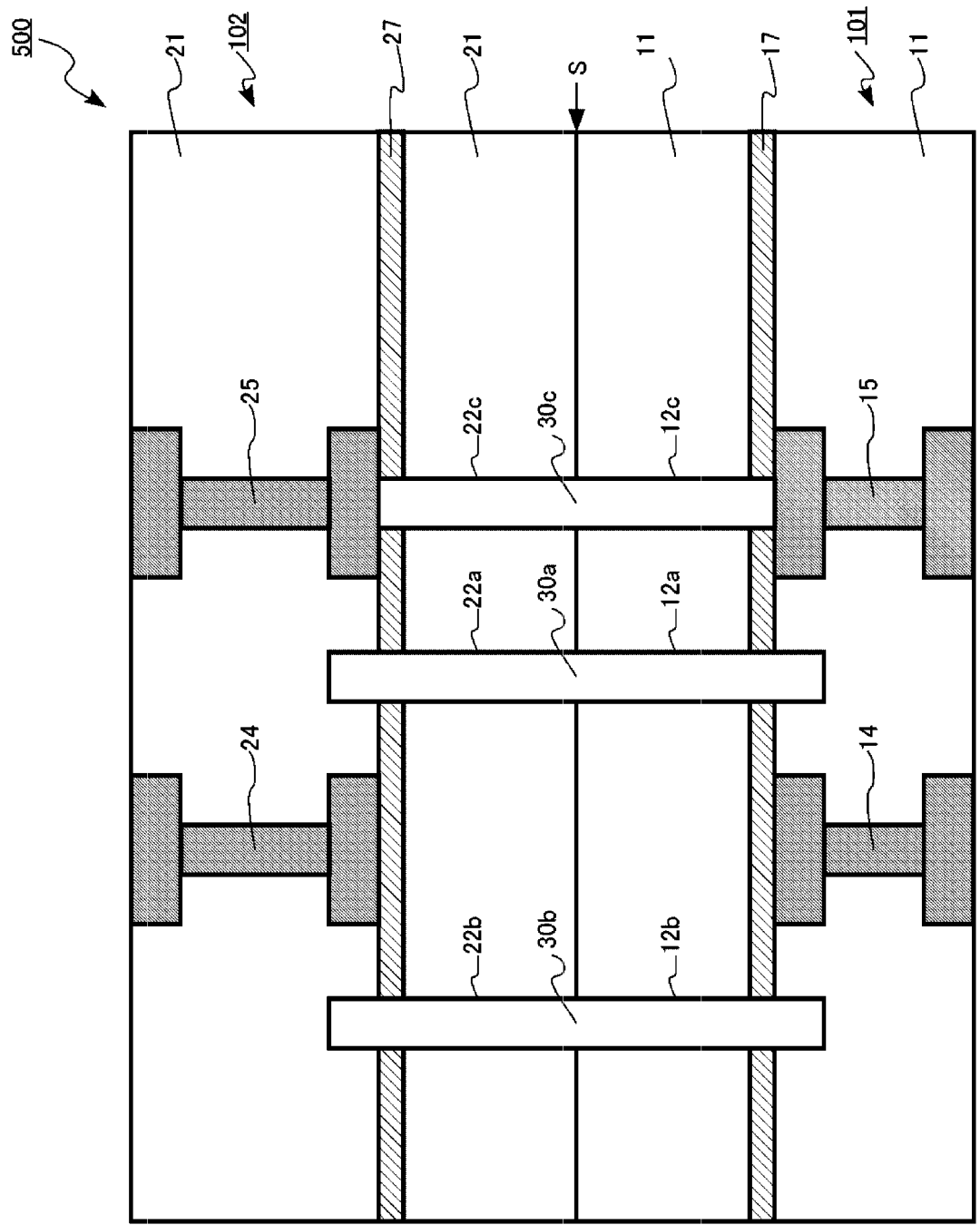
FIG. 14 is an enlarged schematic cross-sectional view of a semiconductor device of a fifth embodiment.

FIG. 14 is an enlarged schematic cross-sectional view of the semiconductor device of the fifth embodiment. FIG. 14 is a cross-sectional view corresponding to FIG. 8 that is based on the first embodiment. In FIG. 14, the side of the first element region 101a is right.

The first interlayer region 11 includes the first recess portion 12a, the first recess portion 12b, and the first recess portion 12c. The second interlayer region 21 includes the second recess portion 22a, the second recess portion 22b, and the second recess portion 22c.

The depth of the first recess portion 12a and the depth of the second recess portion 12b relative to the sticking interface S are deeper than the depth to the first outer edge sealing structure 14 and the depth to the first inner edge sealing structure 15 relative to the sticking interface S. The first inner edge sealing structure 15 is exposed to a bottom surface of the first recess portion 12c.

The depth of the second recess portion 22a and the depth of the second recess portion 22b relative to the sticking interface S are deeper than the depth to the second outer edge sealing structure 24 and the depth to the second inner edge sealing structure 25 relative to the sticking interface S.

The second inner edge sealing structure 25 is exposed to a bottom surface of the second recess portion 22c.

The flash memory 500 includes three cavities, that is, cavities 30a, 30b, and 30c. Since the flash memory 500 includes the three cavities, the progression of a crack can be further hindered as compared with a case where just one cavity is provided.

According to the fifth embodiment, a semiconductor device that decreases defects caused by dicing can be provided.

Sixth Embodiment

A semiconductor device of a sixth embodiment includes the first substrate including the first element region, the first peripheral region that surrounds the first element region, the first insulator region that is provided in the first element region and the first peripheral region, and includes the first recess portion in the first peripheral region, the first metal layer that is provided in the first element region, the first conductor is provided in the first insulator region of the first peripheral region, and surrounds the first element region, and the first semiconductor layer that includes the first insulator region interposed between the first metal layer and the first semiconductor layer, and the second substrate including the second element region, the second peripheral region that surrounds the second element region, the second insulator region that is provided in the second element region and the second peripheral region, includes the second recess portion facing the first recess portion in the second peripheral region, and is in contact with the first insulator region, the second metal layer that is provided in the second element region, and is in contact with the first metal layer, the second conductor that is provided in the second insulator region of the second peripheral region, and surrounds the second element region, the second semiconductor layer that includes the second insulator region interposed between the second metal layer and the second semiconductor layer, and an encircling conductive layer that is provided in the second semiconductor layer of the second peripheral region, is in contact with the second conductor, and surrounds the second element region.

The semiconductor device of the sixth embodiment is different from the semiconductor device of the first embodiment in that the second substrate includes an encircling conductive layer that is provided in the second semiconductor layer of the second peripheral region and is in contact with the second conductor. The circular conductive layer surrounds the second element region.

The semiconductor device of the sixth embodiment is a flash memory 600. The flash memory 600 is a three-dimensional NAND flash memory in which a memory cell is three-dimensionally arranged.

Figure 15:
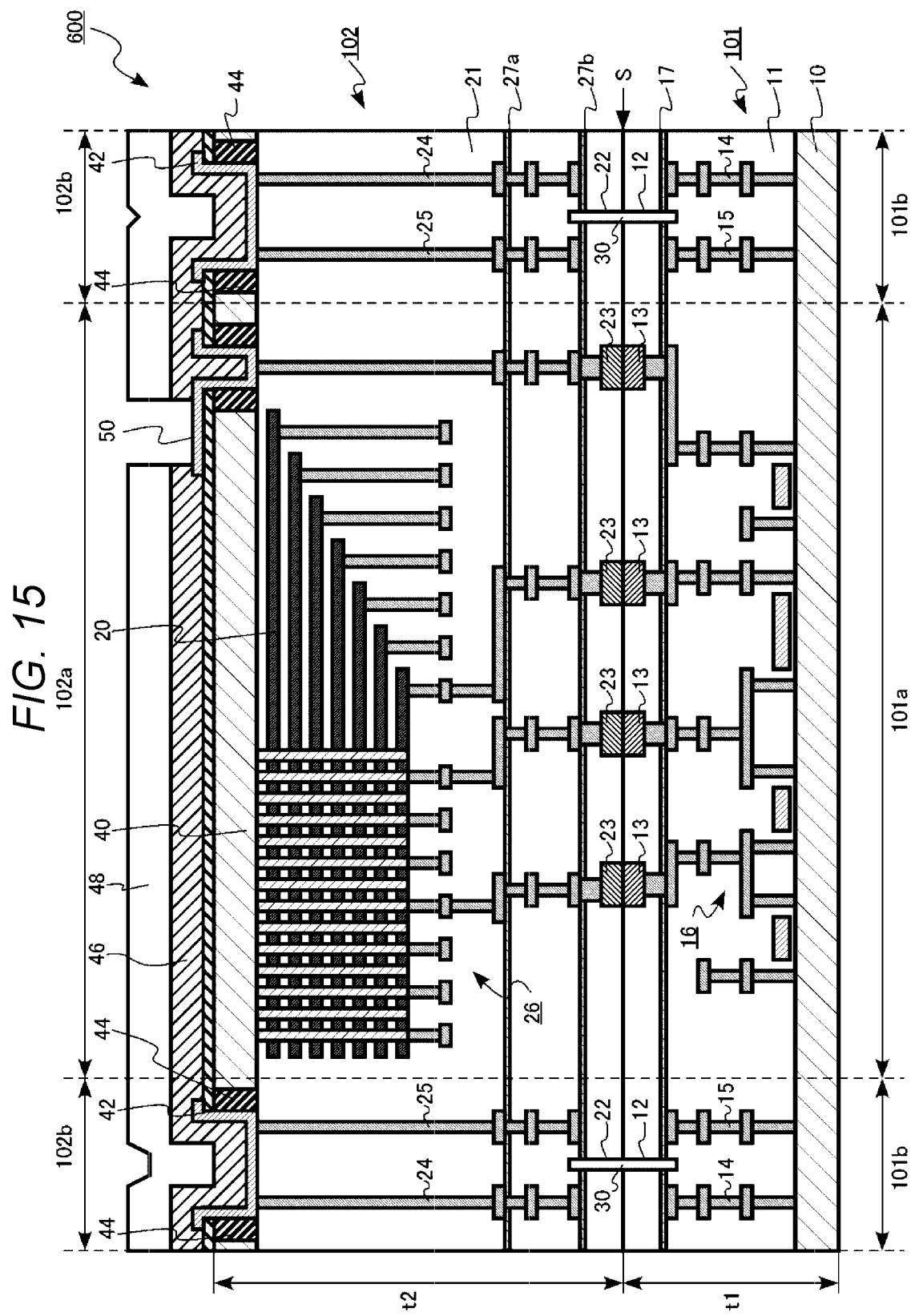
FIG. 15 is a schematic cross-sectional view of a semiconductor device of a sixth embodiment.

FIG. 15 is a schematic cross-sectional view of the semiconductor device of the sixth embodiment.

The flash memory 600 of the sixth embodiment includes the control chip 101 and the memory chip 102. The control chip 101 is an example of the first substrate. The memory chip 102 is an example of the second substrate.

The control chip 101 and the memory chip 102 are at the sticking interface S.

The control chip 101 includes the first element region 101a, the first peripheral region 101b, the first semiconductor layer 10, the first interlayer region 11, the first recess portion 12, the plurality of first metal pads 13, the first outer edge sealing structure 14, the first inner edge sealing structure 15, the control circuit 16, and the first diffusion preventing layer 17.

The first interlayer region 11 is an example of the first insulator region. The first metal pads 13 are each an example of the first metal layer. The first outer edge sealing structure 14 is an example of the first conductor. The first inner edge sealing structure 15 is an example of the third conductor. The first diffusion preventing layer 17 is an example of the first insulating layer.

The memory chip 102 includes the second element region 102a, the second peripheral region 102b, the second semiconductor layer 20, the second interlayer region 21, the second recess portion 22, the plurality of second metal pads 23, the second outer edge sealing structure 24, the second inner edge sealing structure 25, the memory cell array 26, second diffusion preventing layers 27a and 27b, a rear surface-insulating film 40, an aluminum layer 42, a side wall-insulating layer 44, a protection insulating layer 46, a polyimide layer 48, and an electrode pad 50.

The second interlayer region 21 is an example of the second insulator region. The second metal pads 23 are each an example of the second metal layer. The second outer edge sealing structure 24 is an example of the second conductor. The aluminum layer 42 is an example of the encircling conductive layer. The side wall-insulating layer 44 is an example of the insulating layer.

The flash memory 100 has the cavity 30.

Figure 16:
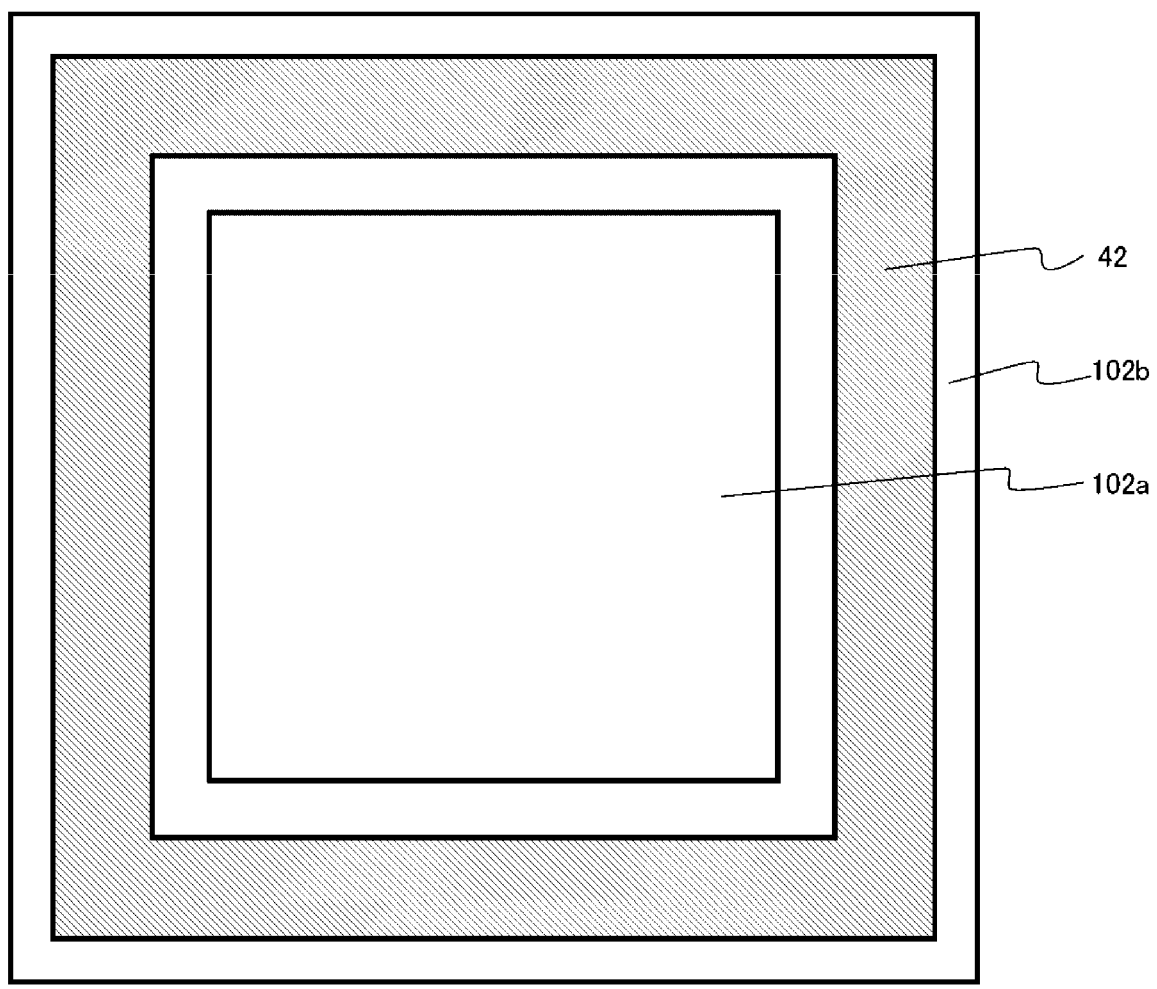
FIG. 16 is a schematic plan view of a memory chip of the sixth embodiment.

FIG. 16 is a schematic plan view of the memory chip 102 of the first embodiment. FIG. 16 represents a pattern layout of the memory chip 102 when viewed from an interface between the second semiconductor layer 20 and the second interlayer region 21.

The memory chip 102 has the second element region 102a and the second peripheral region 102b. The second peripheral region 102b surrounds the second element region 102a.

The aluminum layer 42 is provided in the second semiconductor layer 20 of the second peripheral region 102b. The aluminum layer 42 is in contact with the second outer edge sealing structure 24 and the second inner edge sealing structure 25. The aluminum layer 42 is passed through the second semiconductor layer 20.

For example, the aluminum layer 42 is formed from the same material as a material for the electrode pad provided in the flash memory 600 and at the same time as formation of the electrode pad. As illustrated in FIG. 16, the aluminum layer 42 surrounds the second element region 102a. The aluminum layer 42 encircles (surrounds) the second element region 102a.

The aluminum layer 42 has a function of stopping the extension of a crack from the end of the second peripheral region 102b to the second element region 102a when the wafers are diced to produce the flash memory 600.

The side wall-insulating layer 44 is provided between the aluminum layer 42 and the second semiconductor layer 20. The side wall-insulating layer 44 is, for example, silicon oxide.

The protection insulating layer 46 is a layered film including a silicon oxide film and a silicon nitride film that is on the silicon oxide film. The polyimide layer 48 is formed on the protection insulating layer 46. An opening is provided in the protection insulating layer 46 and the polyimide layer 48. The electrode pad 50 is exposed in the opening.

In the first to sixth embodiments, the sticking interface S is referenced as a defined position. However, in a finished product of flash memory, a position of the sticking interface S between the control chip 101 and the memory chip 102 may not be clearly visually recognizable. However, the position of the sticking interface S can be ascertained, for example, from position shifts of the first metal pad 13 and the second metal pad 23, the position shifts of the first recess portion 12 and the second recess portion 22, or the like.

In the first to sixth embodiments, a case where the first recess portion 12, the second recess portion 22, and the cavity 30 are continuous (forming a fully closed shape) has been described as an example. However, the first recess portion 12, the second recess portion 22, and the cavity 30 may be partially divided into different portions and need not be continuous.

In the first to sixth embodiments, a case where shapes of the first recess portion 12 and the second recess portion 22 that face to each other are symmetric has been described as an example. However, the shapes of the first recess portion 12 and the second recess portion 22 may not be symmetric in other embodiments.

In the first to sixth embodiments, a case where the first outer edge sealing structure 14 has a square shape when viewed from the sticking interface S has been described as an example. However, the shape of the first outer edge sealing structure 14 is not limited to a square, and for example, may be a polygon such as an octagon. A region corresponding to a corner of the square of the first outer edge sealing structure 14 may be a curve. The same is applied to the first inner edge sealing structure 15, the second outer edge sealing structure 24, and the second inner edge sealing structure 25.

In the first to sixth embodiments, a case where the first recess portion 12 has a square shape at the sticking interface S has been described as an example. However, the shape of the first recess portion 12 is not limited to a square, and for example, may be a polygon such as an octagon. A region corresponding to a corner of the square of the first recess portion 12 may be a curve. The same is applied to the second recess portion 22.

In the first to sixth embodiments, a case where the control chip 101 includes the first semiconductor layer 10 and the memory chip 102 includes the second semiconductor layer 20 has been described as an example. However, any one or both of the first semiconductor layer 10 and the second semiconductor layer 20 may not be used in other embodiments.

In the first to sixth embodiments, a case where the flash memory includes the control chip 101 as the first substrate and the memory chip 102 as the second substrate has been described as an example. However, the semiconductor device of the embodiments is not limited to flash memory including the control chip 101 and the memory chip 102. For example, the embodiments may also be applied to a photosensor including a control chip as a first substrate and a pixel chip as a second substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first substrate including:
        a first element region,
        a first peripheral region that surrounds the first element region,
        a first insulator in the first element region and the first peripheral region and having a first recess portion in the first peripheral region,
        a first metal layer in the first element region and at an uppermost surface of the first substrate, and
        a first conductor in the first peripheral region in the first insulator below an uppermost surface of the first substrate, the first conductor surrounding the first element region; and
    a second substrate including:
        a second element region,
        a second peripheral region that surrounds the second element region,
        a second insulator in the second element region and the second peripheral region and in contact with the first insulator, the second insulator having a second recess portion that is in the second peripheral region and faces the first recess portion,
        a second metal layer in the second element region at a surface of the second substrate facing the uppermost surface of the first substrate, the second metal layer directly contacting the first metal layer, and
        a second conductor in the second peripheral region in the second insulator away from the surface of the second substrate, the second conductor surrounding the second element region, wherein
    the first recess portion and the second recess portion connect to each other and form a cavity,
    the cavity surrounds both the first metal layer and the second metal layer,
    the first conductor and the second conductor are separated from one another in a direction orthogonal to the uppermost surface of the first substrate and do not connect to one another, and
    a gas is in the cavity.

2. The semiconductor device according to claim 1, wherein
    the first recess portion completely encircles the first element region, and
    the second recess portion completely encircles the second element region.

3. The semiconductor device according claim 1, wherein
    the first substrate further includes a first semiconductor layer, the first insulator being between the first semiconductor layer and the second substrate, and
    the first conductor contacts the first semiconductor layer.

4. The semiconductor device according to claim 1, wherein a distance between the interface between the uppermost surface of the first substrate and the surface of the second substrate and a bottom surface of the first recess portion is greater than a distance between the interface and the first conductor.

5. The semiconductor device according to claim 1, wherein the first conductor is exposed at the bottom surface of the first recess portion.

6. The semiconductor device according to claim 1, wherein
    the first substrate further includes a first insulating layer comprising silicon and nitrogen,
    the first insulating layer is between the first conductor and the interface between the first substrate and the second substrate, and a distance between the interface and a bottom surface of the first recess portion is less than a distance between the interface and the first insulating layer.

7. The semiconductor device according to claim 1,
wherein the first substrate further includes a third conductor in the first insulator in the first peripheral region,
the third conductor surrounds the first element region,
the third conductor is closer to the first element region than is the first conductor,
the first recess portion is between the first conductor and the third conductor;
the second substrate further includes a fourth conductor in the second insulator in the second peripheral region,
the fourth conductor surrounds the second element region,
the fourth conductor is closer to the second element region than is the second conductor, and
the second recess portion is between the second conductor and the fourth conductor.

8. The semiconductor device according to claim 1, wherein the first recess portion has an aspect ratio of at least three.

9. The semiconductor device according to claim 1, wherein the first recess portion has a width in a range of 0.5 µm to 10 µm.

10. The semiconductor device according claim 1, wherein the first metal layer and the second metal layer comprise copper.

11. The semiconductor device according to claim 1, wherein
the first element region includes a control circuit, and
the second element region includes a memory cell array that is controlled by the control circuit.

12. The semiconductor device according to claim 11, wherein
the first metal layer is electrically connected to the control circuit, and
the second metal layer is electrically connected to the memory cell array.

13. The semiconductor device according to claim 1, wherein a thickness of at least one of the first substrate and the second substrate in a direction perpendicular to the interface between the first substrate and the second substrate is at least 5 µm.

14. The semiconductor device according to claim 1, wherein only the gas fills the cavity.

* * * * *